(12) United States Patent
Nakao et al.

(10) Patent No.: US 10,937,799 B2
(45) Date of Patent: Mar. 2, 2021

(54) SEMICONDUCTOR DEVICE AND METHOD OF MANUFACTURING THE SAME

(71) Applicant: TOSHIBA MEMORY CORPORATION, Minato-ku (JP)

(72) Inventors: Shinichi Nakao, Yokkaichi (JP); Kei Watanabe, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/291,120

(22) Filed: Mar. 4, 2019

(65) Prior Publication Data
US 2020/0091178 A1 Mar. 19, 2020

(30) Foreign Application Priority Data

Sep. 14, 2018 (JP) .............................. JP2018-172317

(51) Int. Cl.
| | |
|---|---|
| *H01L 27/11582* | (2017.01) |
| *H01L 27/11521* | (2017.01) |
| *H01L 27/1156* | (2017.01) |
| *H01L 27/11519* | (2017.01) |
| *H01L 21/28* | (2006.01) |
| *H01L 27/11556* | (2017.01) |
| *H01L 21/02* | (2006.01) |

(Continued)

(52) U.S. Cl.
CPC .... *H01L 27/11582* (2013.01); *H01L 21/0223* (2013.01); *H01L 23/562* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 29/408* (2013.01); *H01L 29/40114* (2019.08); *H01L 29/40117* (2019.08)

(58) Field of Classification Search
CPC combination set(s) only.
See application file for complete search history.

(56) References Cited

U.S. PATENT DOCUMENTS

| | | | | |
|---|---|---|---|---|
| 2009/0146206 A1* | 6/2009 | Fukuzumi | ......... | H01L 27/11556 257/324 |
| 2015/0060998 A1* | 3/2015 | Mizushima | ....... | H01L 27/11582 257/330 |

FOREIGN PATENT DOCUMENTS

| | | |
|---|---|---|
| JP | 2012-28590 | 2/2012 |
| JP | 2013-243177 | 12/2013 |
| JP | 2015-50375 | 3/2015 |

* cited by examiner

*Primary Examiner* — Mounir S Amer
(74) *Attorney, Agent, or Firm* — Oblon, McClelland, Maier & Neustadt, L.L.P.

(57) ABSTRACT

In one embodiment, a semiconductor device includes electrode layers and insulating layers alternately provided on a substrate and stacked in a first direction perpendicular to a surface of the substrate, and semiconductor layers provided in the electrode layers and insulating layers, extending in the first direction, and adjacent to each other in a second direction parallel to the surface of the substrate. The device further includes first and second charge trapping layers provided between the semiconductor layers and electrode layers sandwiching the semiconductor layers in a third direction parallel to the surface of the substrate. The device further includes insulators provided between the semiconductor layers being adjacent to each other in the second direction, and including a first insulator having a first width, and a second insulator having a second width longer than the first width and having nitrogen concentration different from that in the first insulator.

9 Claims, 13 Drawing Sheets

(51) Int. Cl.
*H01L 27/11565* (2017.01)
*H01L 29/40* (2006.01)
*H01L 23/00* (2006.01)
*H01L 27/11568* (2017.01)

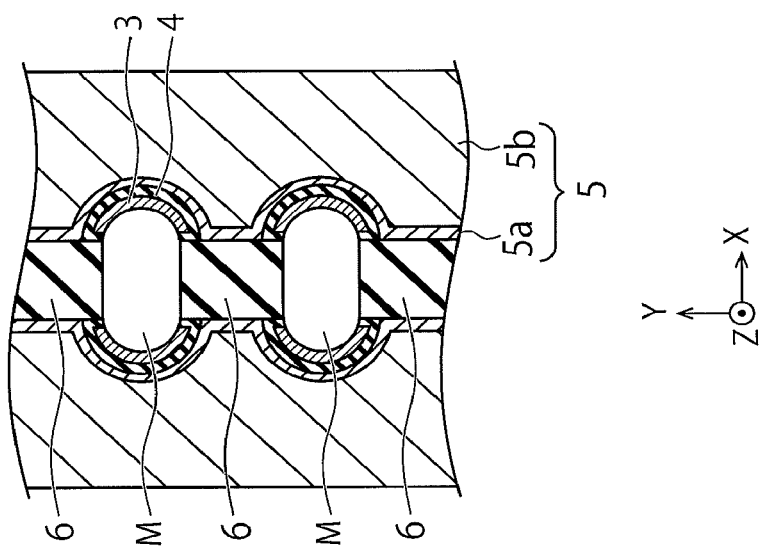
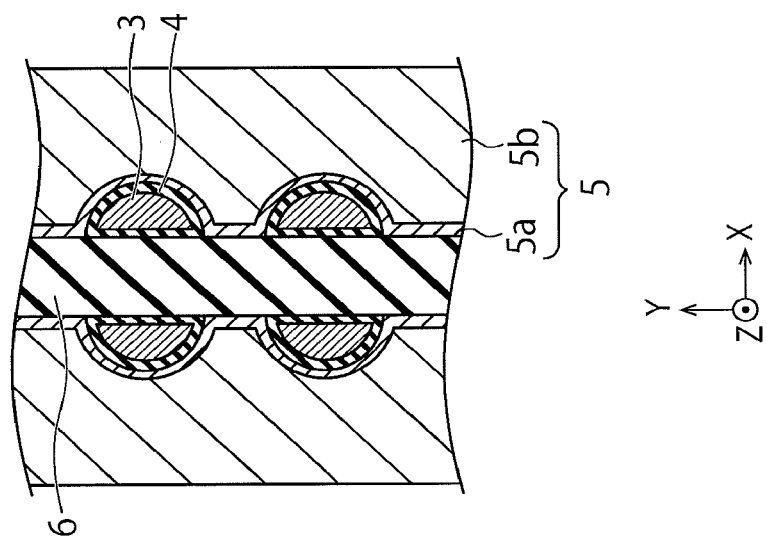
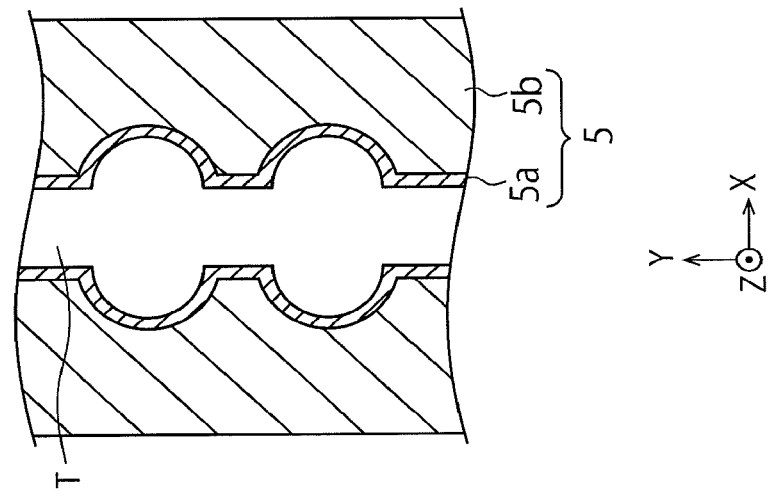

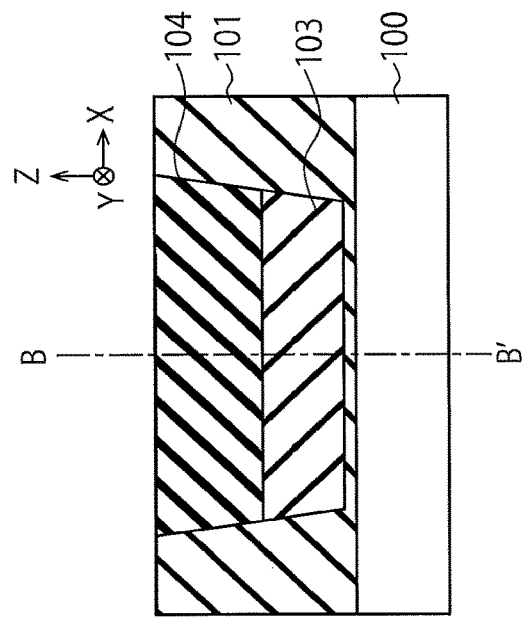
FIG. 11A
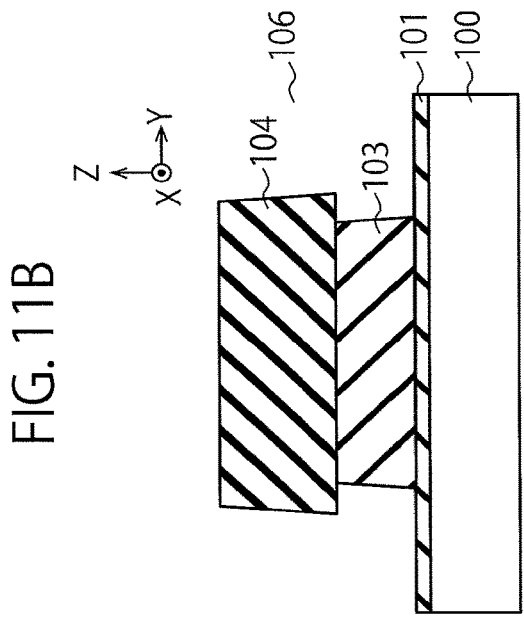
FIG. 11B
FIG. 11C
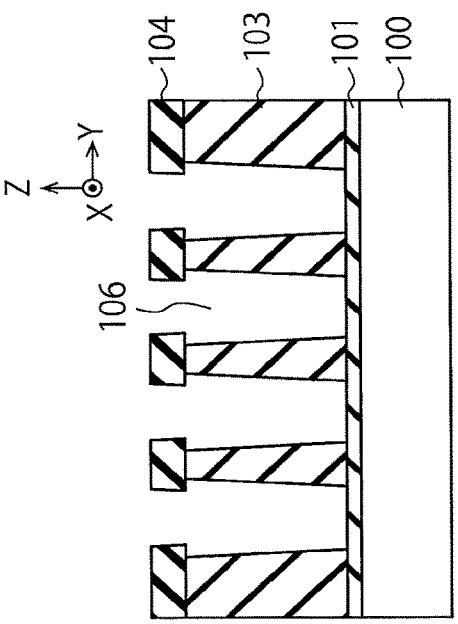
FIG. 11D

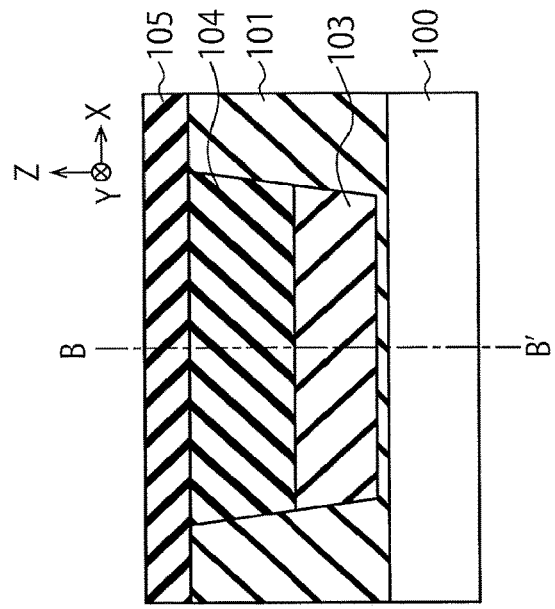
FIG. 13A
FIG. 13B
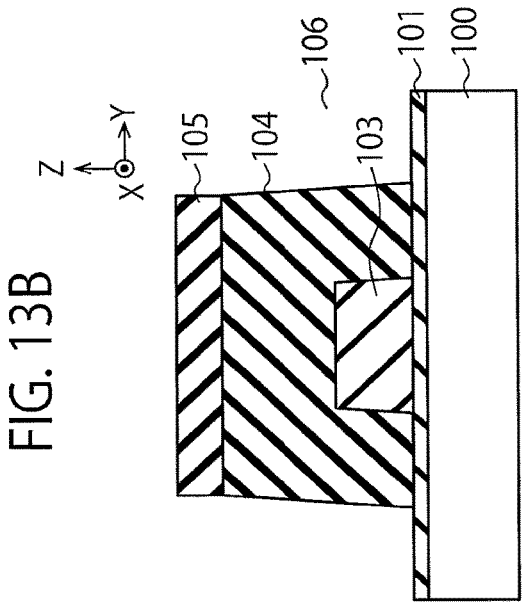
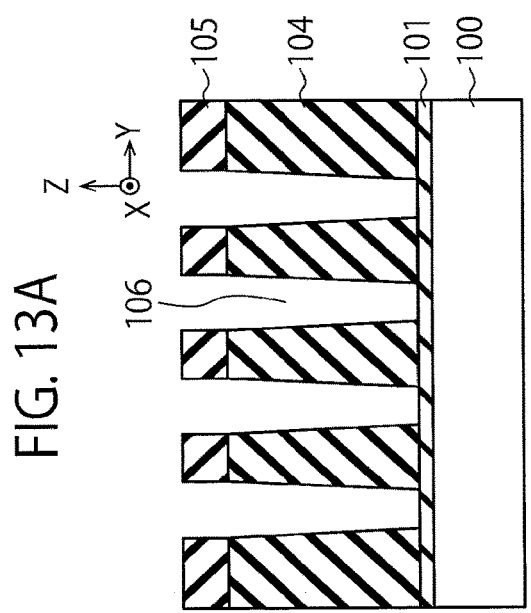
FIG. 13C
FIG. 13D

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2018-172317, filed on Sep. 14, 2018, the entire contents of which are incorporated herein by reference.

FIELD

Embodiments described herein relate to a semiconductor device and a method of manufacturing the same.

BACKGROUND

There is a case where an oxide film is formed by supplying a coating liquid on a substrate and oxidizing the coating liquid. In this case, if the coating liquid is not sufficiently oxidized, there is a problem that performance of the obtained oxide film such as etching resistance of the oxide film is lowered. This similarly applies to a case where a film other than the oxide film is formed from a material other than the coating liquid.

BRIEF DESCRIPTION OF THE DRAWINGS

FIGS. 3A to 3C are cross-section views illustrating a method of manufacturing the semiconductor device of the first embodiment;

FIGS. 11A to 11D are cross-section views illustrating a method of manufacturing a semiconductor device in a comparative example of the first embodiment;

FIGS. 13A to 13D are cross-section views illustrating a method of manufacturing a semiconductor device in a modified example of the first embodiment.

DETAILED DESCRIPTION

Figure 1A:
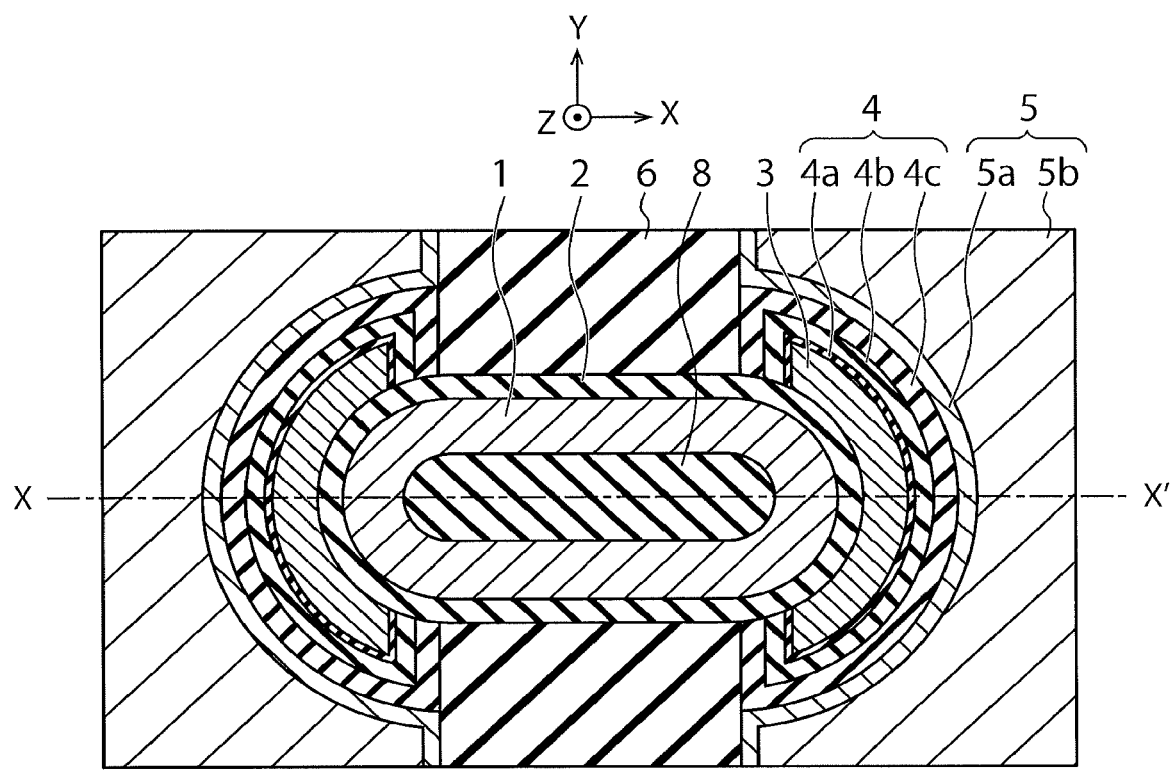
FIGS. 1A and 1B are cross-section views illustrating a structure of a semiconductor device of a first embodiment.

In one embodiment, a semiconductor device includes a plurality of electrode layers and a plurality of insulating layers alternately provided on a substrate and stacked in a first direction perpendicular to a surface of the substrate. The device further includes a plurality of semiconductor layers provided in the electrode layers and the insulating layers, extending in the first direction, and being adjacent to each other in a second direction parallel to the surface of the substrate. The device further includes first and second charge trapping layers provided between the semiconductor layers and the electrode layers sandwiching the semiconductor layers in a third direction that is parallel to the surface of the substrate and is different from the second direction. The device further includes a plurality of insulators provided between the semiconductor layers that are adjacent to each other in the second direction, and including a first insulator having a first width in the second direction, and a second insulator having a second width that is longer than the first width in the second direction and having nitrogen concentration that is different from nitrogen concentration in the first insulator.

Embodiments will now be explained with reference to the accompanying drawings. The same reference numerals will be assigned to components which are identical or similar in FIGS. 1A to 13D, and redundant description will be omitted.

First Embodiment

Figure 1B:
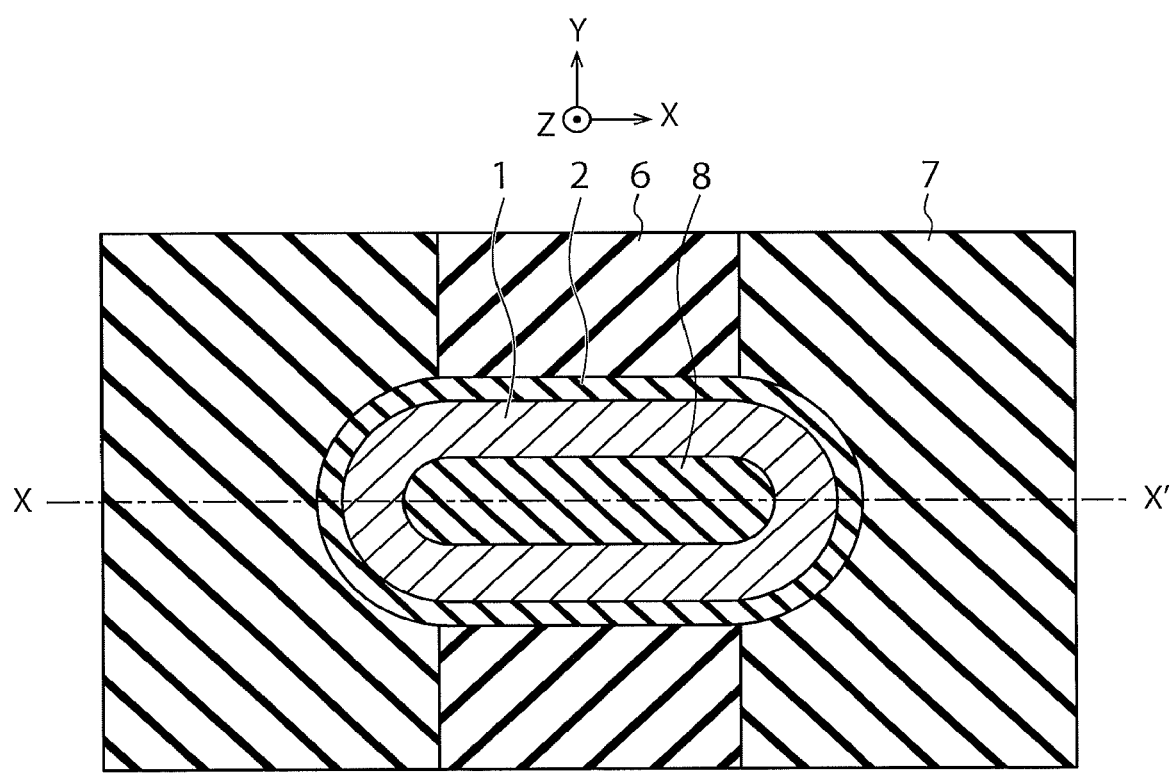

FIGS. 1A and 1B are cross-section views illustrating a structure of a semiconductor device of a first embodiment.

FIG. 1A illustrates a cross-section parallel to a surface of a substrate (not illustrated), and FIG. 1B illustrates another cross-section parallel to the surface of the substrate. The semiconductor device of the present embodiment is, for example, a three-dimensional memory. The structure of the semiconductor device of the present embodiment will be described below with reference to FIG. 1A, and FIG. 1B will be also referred to as appropriate in the description.

The semiconductor device of the present embodiment includes a channel semiconductor layer 1, a tunnel insulator 2, a plurality of floating gates 3 which are an example of charge trapping (storing) layers, a plurality of block insulators 4, a plurality of control gates 5 which are an example of electrode layers, a plurality of buried insulators 6 which are an example of a plurality of insulators including first and second insulators, a plurality of insulating layers 7 and a core insulator 8. Further, each block insulator 4 includes a first block insulator 4a, a second block insulator 4b and a third block insulator 4c. Each control gate 5 includes a barrier metal layer 5a and an electrode material layer 5b.

In the present embodiment, the plurality of control gates 5 and the plurality of insulating layers 7 are alternately formed on the substrate and stacked in a Z direction. The substrate is, for example, a semiconductor substrate such as a silicon substrate. FIG. 1A and FIG. 1B illustrate an X direction and a Y direction which are parallel to the surface of the substrate and which are perpendicular to each other, and the Z direction which is perpendicular to the surface of the substrate. In the present specification, a +Z direction is handled as an upward direction, and a −Z direction is handled as a downward direction. The −Z direction may be the same as a gravity direction or does not have to be the same as the gravity direction. The Z direction is an example of a first direction, the Y direction is an example of a second direction, and the X direction is an example of a third direction.

The barrier metal layer 5a of each control gate 5 is, for example, a titanium nitride film (TiN). The electrode material layer 5b of each control gate 5 is, for example, a tungsten layer (W). Each insulating layer 7 is, for example, a silicon dioxide film ($SiO_2$). FIG. 1A illustrates a cross-section of the control gate 5 corresponding to one layer, and FIG. 1B illustrates a cross-section of the insulating layer 7 corresponding to one layer. The barrier metal layer 5a of the present embodiment is also formed on an upper face and a lower face of the insulating layer 7 as well as at portions illustrated in FIG. 1A. Further, the plurality of control gates 5 and the plurality of insulating layers 7 of the present embodiment are alternately formed on the substrate via some kind of layer (for example, an inter layer dielectric).

The core insulator 8 is formed in these control gates 5 and insulating layers 7 and has a columnar shape extending in the Z direction. The channel semiconductor layer 1 is formed in these control gates 5 and insulating layers 7, has a tubular shape extending in the Z direction, and surrounds the core insulator 8. The tunnel insulator 2 is formed in these control gates 5 and insulating layers 7, has a tubular shape extending in the Z direction, and surrounds the channel semiconductor layer 1. The core insulator 8 is, for example, a silicon dioxide film. The channel semiconductor layer 1 is, for example, a polysilicon layer. The tunnel insulator 2 is, for example, a silicon dioxide film. The semiconductor device of the present embodiment does not have to include the core insulator 8, in which case the channel semiconductor layer 1 has, for example, a columnar shape extending in the Z direction.

The floating gates 3 are formed between the channel semiconductor layer 1 and the control gates 5. As illustrated in FIG. 1A, the floating gates 3 are formed so that the channel semiconductor 1 is put between the floating gates 3, and therefore the channel semiconductor layer 1 is located between the floating gates 3. In other words, the floating gates 3 are formed so as to sandwich the channel semiconductor 1.

One floating gate 3 illustrated in FIG. 1A is an example of a first charge trapping layer, and the other floating gate 3 illustrated in FIG. 1A is an example of a second charge trapping layer. The floating gates 3 are, for example, polysilicon layers, metal layers, silicon nitride films (SiN), or the like. It should be noted that the floating gates 3 are not provided on the cross-section in FIG. 1B, and are split for each control gate 5.

The block insulators 4 are formed between the channel semiconductor layer 1 and the control gates 5. As illustrated in FIG. 1A, the block insulators 4 are formed so that the channel semiconductor 1 is put between the block insulators 4, and, as a result, the channel semiconductor 1 is located between the block insulators 4. The first block insulator 4a, the second block insulator 4b and the third block insulator 4c of the block insulators 4 sequentially and partially surround the corresponding floating gates 3. The first to third block insulators 4a to 4c are, for example, silicon dioxide films, metal insulators, or the like. It should be noted that the block insulators 4 are not provided on the cross-section in FIG. 1B, and are split for each control gate 5.

The buried insulators 6 are formed in the plurality of control gates 5 and the plurality of insulating layers 7 so that the core insulator 8, the channel semiconductor 1 and the tunnel insulator 2 are put between the buried insulators 6. Examples of the buried insulators 6 include a polysilazane (PSZ) film, and an insulator including a polysilazane film and a silicon dioxide film. Polysilazane is a polymer expressed with $(SiH_2NH)_n$ (H is hydrogen, and n is a positive integer), and contains silicon, nitrogen and hydrogen. The floating gates 3 and the block insulators 4 are formed so that the buried insulators 6 are put between the floating gates 3 and the block insulators 4. The barrier metal layer 5a is formed on side faces of the third block insulator 4c and the buried insulators 6.

Figure 2:
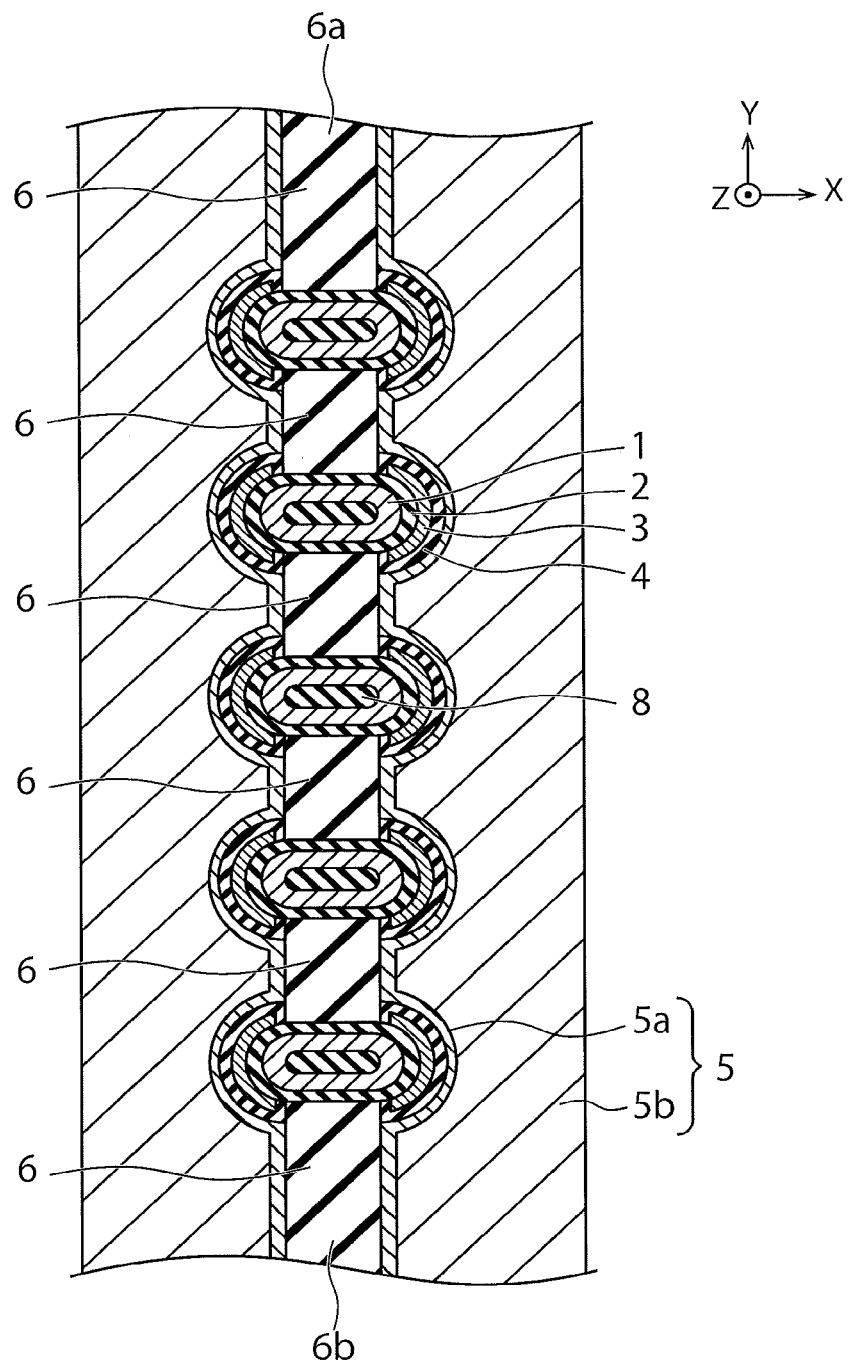
FIG. 2 is another cross-section view illustrating the structure of the semiconductor device of the first embodiment.

FIG. 2 is another cross-section view illustrating the structure of the semiconductor device of the first embodiment. FIG. 2 illustrates the same cross-section as that in FIG. 1A.

As illustrated in FIG. 2, in the semiconductor device of the present embodiment, a plurality of channel semiconductor layers 1 and a plurality of buried insulators 6 are alternately provided along the Y direction. These channel semiconductor layers 1 are adjacent to each other in the Y direction. The semiconductor device of the present embodiment further includes the tunnel insulator 2, the plurality of floating gates 3 and the plurality of block insulators 4 for each channel semiconductor layer 1. FIG. 2 illustrates five memory cells configured with five channel semiconductor layers 1. A structure of each memory cell is as described with reference to FIG. 1.

A reference numeral 6a indicates the buried insulator 6 disposed at an end portion in a +Y direction, and a reference numeral 6b indicates the buried insulator 6 disposed at an end portion in a −Y direction. Surfaces in the +Z direction and in the −Y direction of the buried insulator 6a of the present embodiment are formed with a silicon dioxide film, and other portions are formed with a polysilazane film. Further, surfaces in the +Z direction and in the +Y direction of the buried insulator 6b of the present embodiment are formed with a silicon dioxide film, and other portions are formed with a polysilazane film. Further, surfaces in the +Z direction and in a ±Y direction of other buried insulators 6 of the present embodiment are formed with a silicon dioxide film, and other portions are formed with a polysilazane film or the whole is formed with a silicon dioxide film. In these cases, the polysilazane film is an example of a first material, and the silicon dioxide film is an example of a second material. In the present embodiment, nitrogen concentration in the buried insulator 6a and nitrogen concentration in the buried insulator 6b are lower or higher than nitrogen concentration in other buried insulators 6. Details of the buried insulators 6 will be described later.

FIGS. 3A to 3C are cross-section views illustrating a method of manufacturing the semiconductor device of the first embodiment.

First, a plurality of electrode material layers 5a and a plurality of insulating layers 7 are alternately formed on the substrate, and a trench T which penetrates through these electrode material layers 5b and the insulating layers 7 is formed (FIG. 3A). The electrode material layer 5b is an example of a first film, and the insulating layer 7 is an example of a second film. The trench T includes a band-like region extending in the Y direction and semicircle regions disposed so that the band-like region is put between the semicircle regions. The band-like region is an example of a first region, and the semicircle regions are examples of a second region and a third region. Then, the barrier metal layers 5a are formed on side faces of the electrode material layers 5b (FIG. 3A). The control gates 5 may be formed using a replacement method as will be described later.

Then, the buried insulator 6 is formed in the band-like region of the trench T (FIG. 3B). Then, the block insulators 4 and the floating gates 3 are sequentially formed in the semicircle regions of the trench T (FIG. 3B). To prevent the buried insulator 6 from being formed in the semicircle regions, the semicircle regions may be protected with mask layers before the buried insulator 6 is formed.

Then, a plurality of concave portions M which penetrate through the plurality of electrode material layers 5b, the plurality of insulating layers 7 and the buried insulator 6 are formed (FIG. 3C). By this means, the buried insulator 6 is divided into a plurality of buried insulators 6. As illustrated in FIG. 3C, these concave portions M are formed at positions across the plurality of floating gates 3.

Thereafter, the tunnel insulators 2, the channel semiconductor layers 1 and the core insulators 8 are sequentially formed in the concave portions M. In this manner, the semiconductor device of the present embodiment is manufactured.

The control gates 5 may be formed using a replacement method as follows. First, a plurality of sacrifice layers and the plurality of insulating layers 7 are alternately formed on the substrate, and a trench T which penetrates through these sacrifice layers and insulating layers 7 is formed. The sacrifice layer is, for example, a silicon nitride film. The sacrifice layer is also an example of a first film. Then, the buried insulator 6 is formed in a band-like region of the trench T, and the block insulators 4 and the floating gates 3 are sequentially formed in the semicircle regions of the trench T. Then, the sacrifice layers are removed, and a plurality of cavities are formed between the insulating layers 7. Then, the barrier metal layers 5*a* and the electrode material layers 5*b* are sequentially formed in these cavities to form the control gates 5. In this case, the barrier metal layers 5*a* are also formed on upper faces and lower faces of the insulating layers 7 as well as at portions illustrated in FIG. 3A to FIG. 3C (see FIG. 4).

Figure 4:
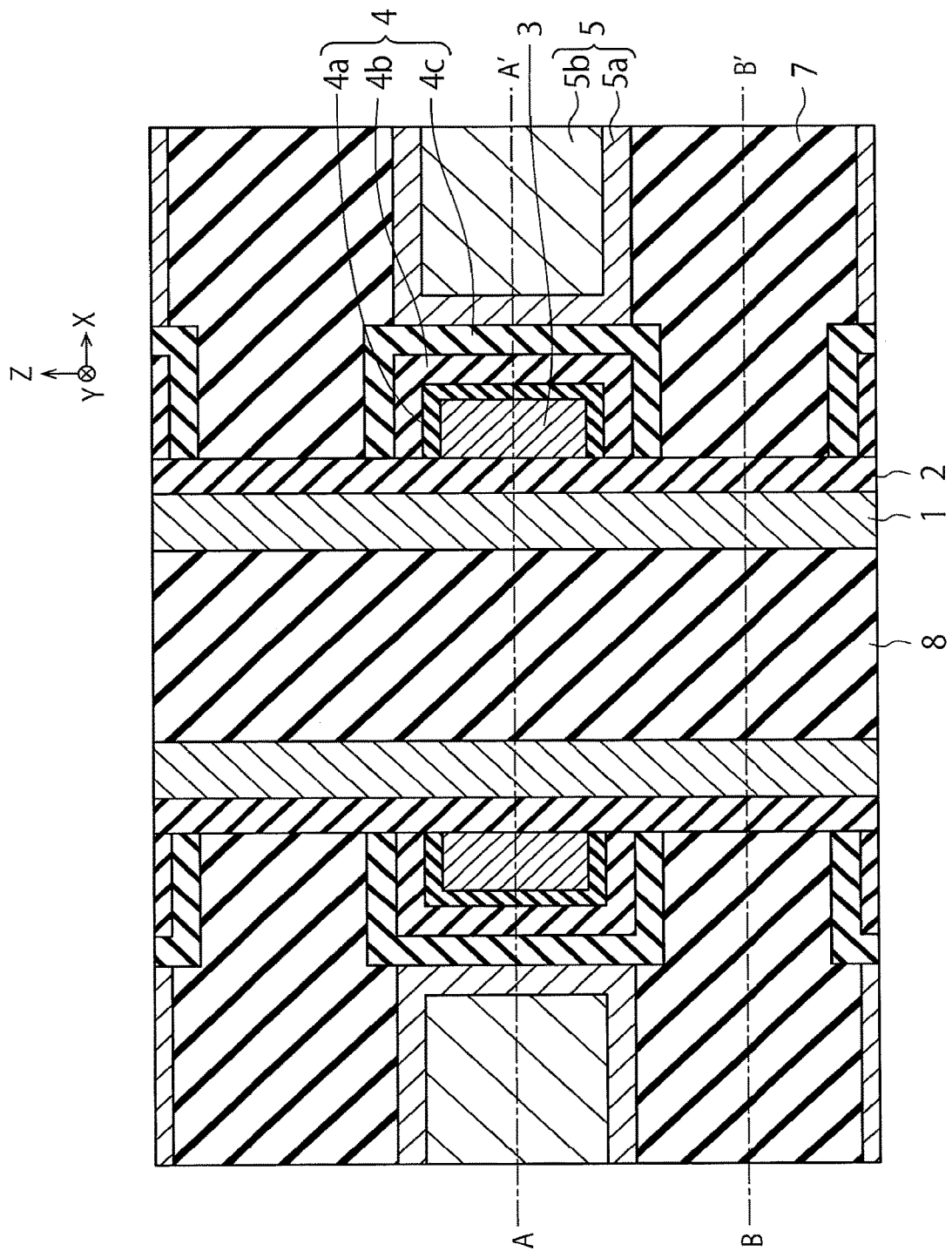
FIG. 4 is a cross-section view illustrating the structure of the semiconductor device of the first embodiment.

FIG. 4 is a cross-section view illustrating the structure of the semiconductor device of the first embodiment, and illustrates a cross-section along a line X-X' illustrated in FIG. 1A and FIG. 1B. Meanwhile, FIG. 1A and FIG. 1B respectively illustrate cross-sections along a line A-A' and a line B-B' illustrated in FIG. 4. It should be noted that, in FIG. 4, the barrier metal layers 5*a* are formed on side faces of the third block insulators 4*c*, and upper faces and lower faces of the insulating layers 7.

In the present embodiment, the buried insulators 6 are oxidized twice in processes from FIG. 3A to FIG. 3C. By this means, at least part of the polysilazane film contained in the buried insulators 6 turns into a silicon dioxide film. Details of such oxidation will be described later.

FIG. 5A to FIG. 10D are cross-section views illustrating the method of manufacturing the semiconductor device of the first embodiment.

Figure 5A:
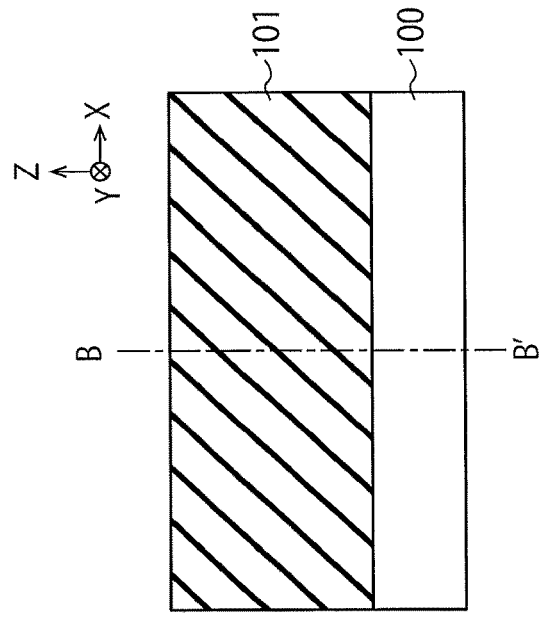
FIGS. 5A to 10D are cross-section views illustrating the method of manufacturing the semiconductor device of the first embodiment.
Figure 5B:
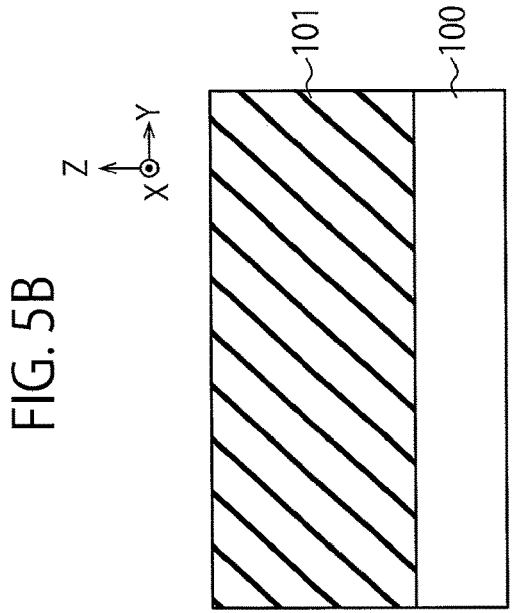
Figure 5C:
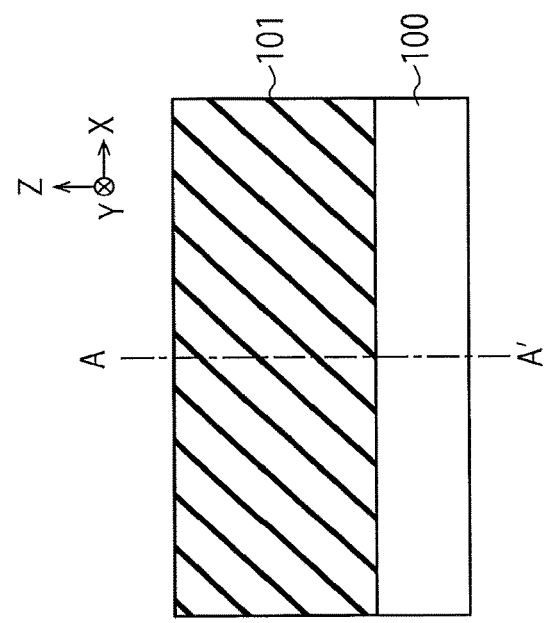
Figure 5D:
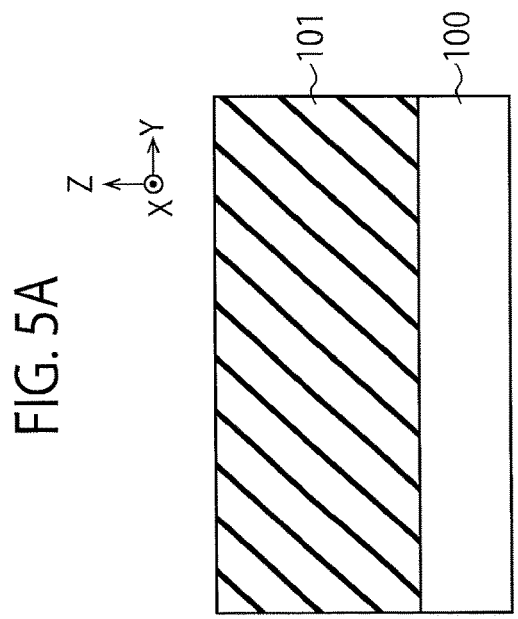

FIG. 5A and FIG. 5B illustrate different XZ cross-sections. FIG. 5C illustrates a YZ cross-section along a line A-A' in FIG. 5A, and FIG. 5D illustrates a YZ cross-section along a line B-B' in FIG. 5B. This similarly applies to FIG. 6A to FIG. 10D.

First, a laminated film 101 is formed on a substrate 100 (FIG. 5A to FIG. 5D). The substrate 100 is, for example, a semiconductor substrate such as a silicon substrate as described above. The laminated film 101 alternately includes the plurality of electrode material layers 5*b* (or sacrifice layers) and the plurality of insulating layers 7.

Figure 6A:
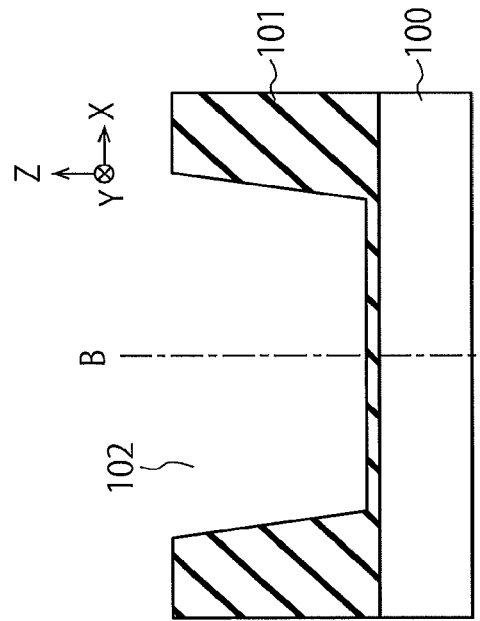
Figure 6B:
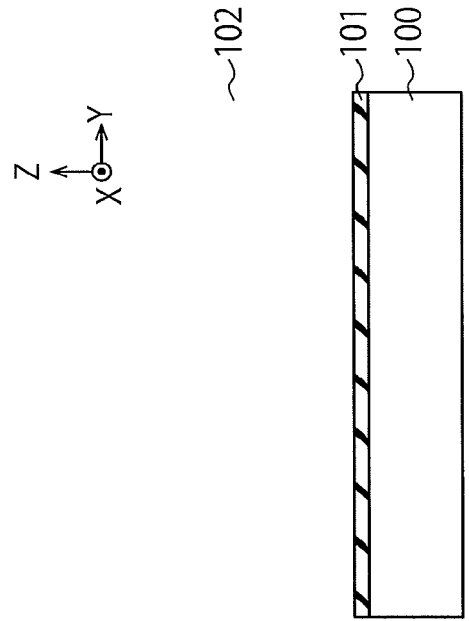
Figure 6C:
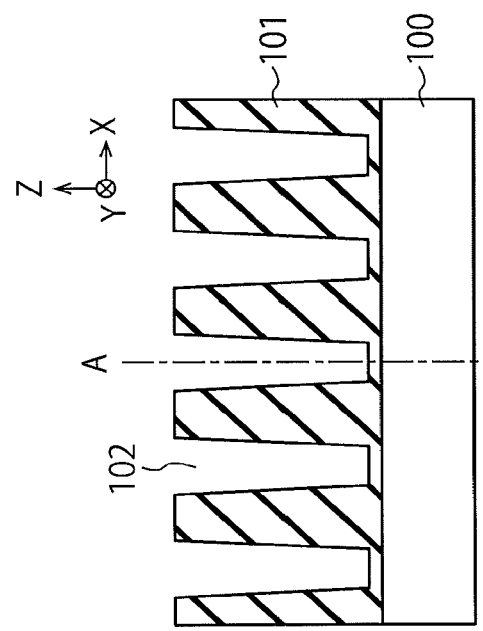
Figure 6D:
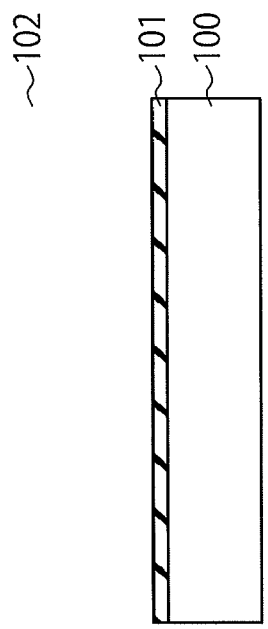
Figure 7A:
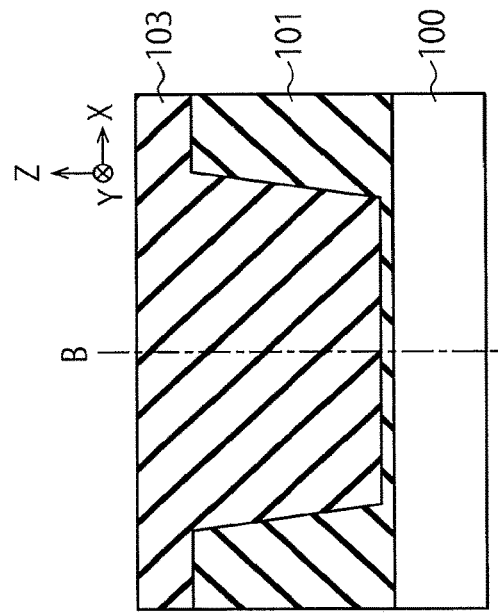
Figure 7B:
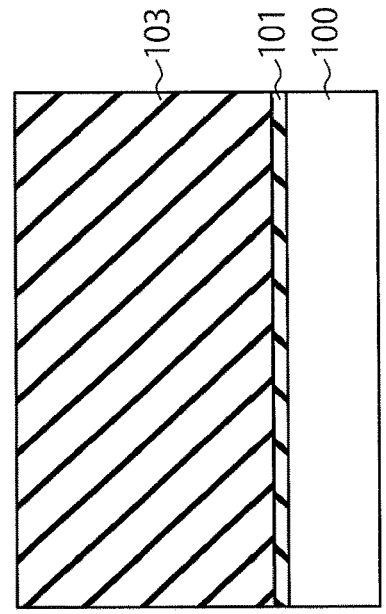
Figure 7C:
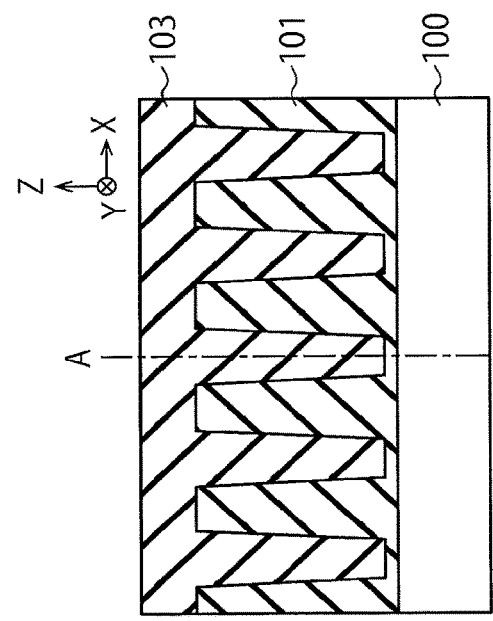
Figure 7D:
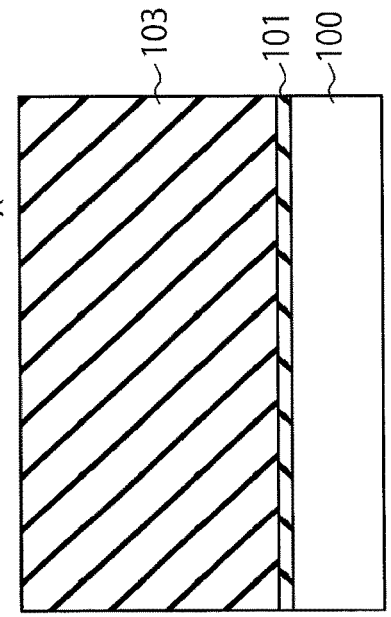

Then, a plurality of trenches 102 extending in the Y direction are formed in the laminated film 101 through lithography and etching (FIG. 6A to FIG. 6D). FIG. 6A illustrates a region where the trenches 102 with a narrow width in the X direction are formed, and FIG. 6B illustrates a region where the trenches 102 with a wide width in the X direction are formed. The width of the trenches 102 in the X direction in FIG. 6A is, for example, 100 nm. The width of the trenches 102 in the X direction in FIG. 6B is, for example, 1 µm. The trenches 102 are the same as the trenches T illustrated in FIG. 3A.

Then, an insulator 103 is formed on the laminated film 101, and the insulator 103 is buried in the trenches 102 (FIG. 7A to FIG. 7D). The insulator 103 is, for example, a coating liquid such as a polysilazane liquid. Polysilazane is a polymer expressed with $(SiH_2NH)_n$, and contains silicon, nitrogen and hydrogen. The insulator 103 is the same as the buried insulators 6 illustrated in FIG. 3B. The polysilazane liquid is an example of a first material, and the insulator 103 is an example of a first portion.

The insulator 103 may be formed with a material other than the coating liquid, and may be formed with a coating liquid other than the polysilazane liquid. Further, the insulator 103 may be formed directly on the laminated film 101, or may be formed on the laminated film 101 via a thin film layer such as a silicon layer, a silicon dioxide film and a silicon nitride film.

Then, part of the insulator 103 is oxidized through a post-oxidation process such as water vapor (steam) annealing (FIG. 8A to FIG. 8D). As a result, part of the insulator 103 turns into an insulator 104 formed with a silicon dioxide film. The silicon dioxide film is an example of a second material, and the insulator 104 formed through this oxidation is an example of a second portion.

Oxidation of the insulator 103 proceeds from an upper face of the insulator 103. Therefore, only the upper portion of the insulator 103 turns into the insulator 104, and a lower portion of the insulator 103 remains to be the insulator 103. As a result, the insulator 104 is formed on the upper face of the insulator 103.

Figure 8A:
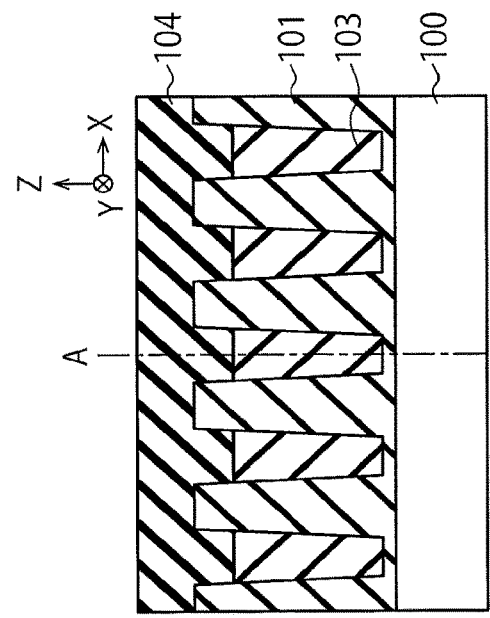
Figure 8B:
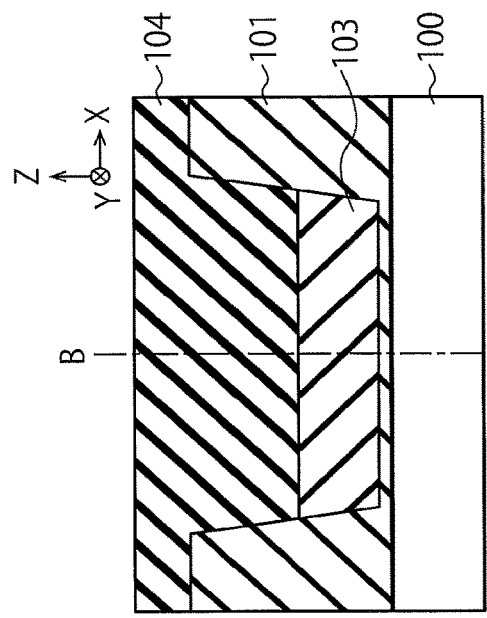
Figure 8C:
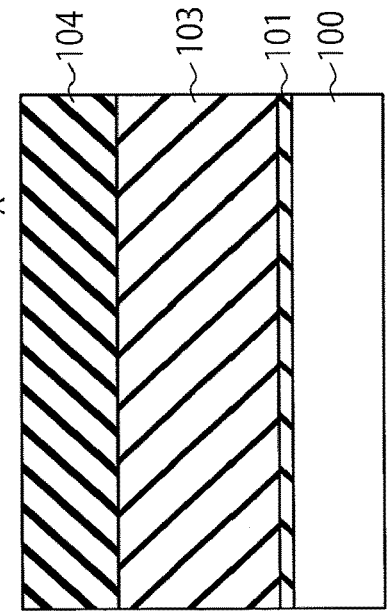

However, in FIG. 8A and FIG. 8C, because a width of the trenches 102 is narrow, the insulator 103 is less likely to be oxidized. Reasons are that oxidizing species of the post-oxidation process are less likely to penetrate into the narrow trenches 102, and the dense insulator 104 inhibits penetration of the oxidizing species into the trenches 102. Therefore, most of the insulator 103 in the trenches 102 remains to be the insulator 103.

Figure 8D:
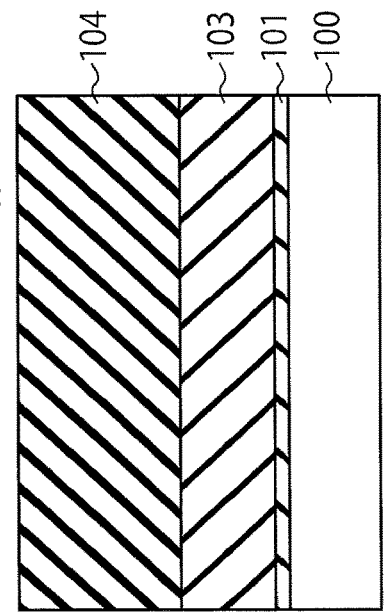

Meanwhile, in FIG. 8B and FIG. 8D, because the width of the trenches 102 is wide, the insulator 103 is likely to be oxidized. Therefore, most of the insulator 103 in the trenches 102 turns into the insulator 104.

Then, an upper face of the insulator 104 is polished through CMP (Chemical Mechanical Polishing) (FIG. 9A to FIG. 9D). As a result, the insulator 104 outside the trenches 102 is removed.

Then, a hard mask layer 105 is formed on the whole surface of the substrate 100, and a plurality of concave portions 106 extending in the X direction are formed in the laminated film 101, the insulator 103 and the insulator 104 through lithography and etching (FIG. 10A to FIG. 10D). As a result, the insulator 103 as well as the insulator 104 is exposed at the concave portions 106. The concave portions 106 are the same as the concave portions M illustrated in FIG. 3C.

Figure 9A:
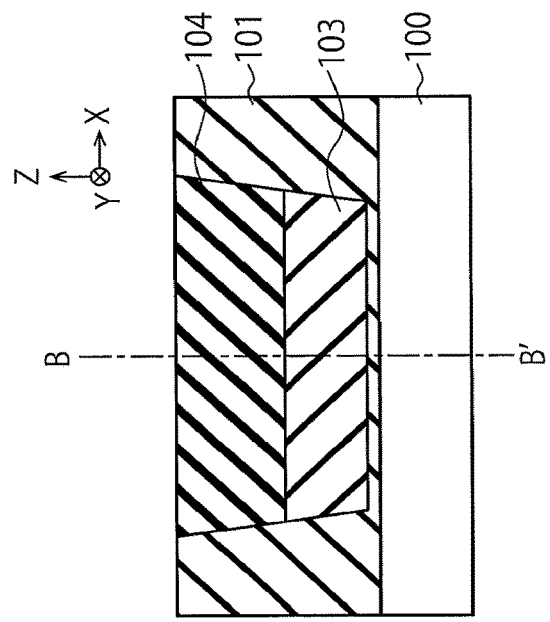
Figure 9B:
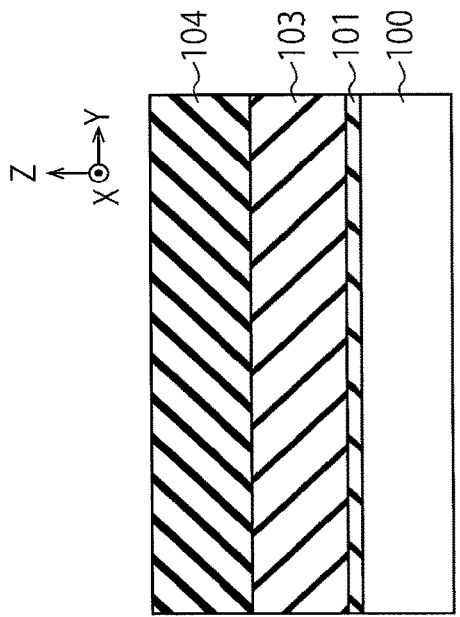
Figure 9C:
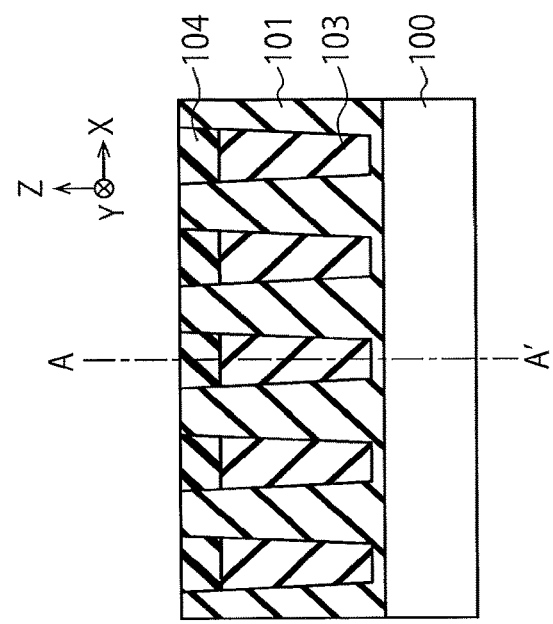
Figure 9D:
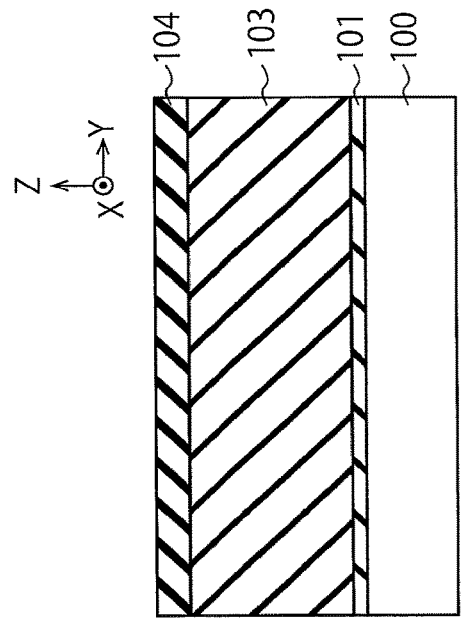
Figure 10B:
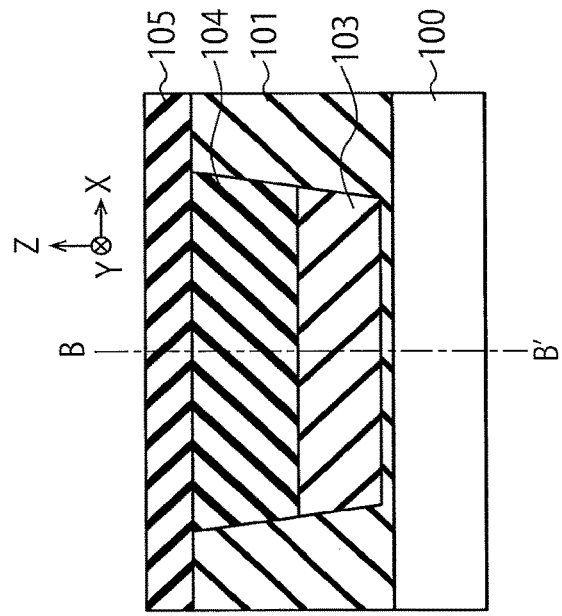
Figure 10D:
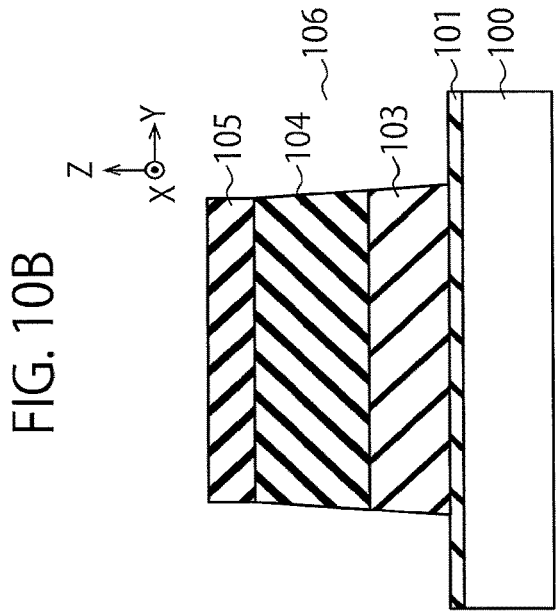
Figure 10A:
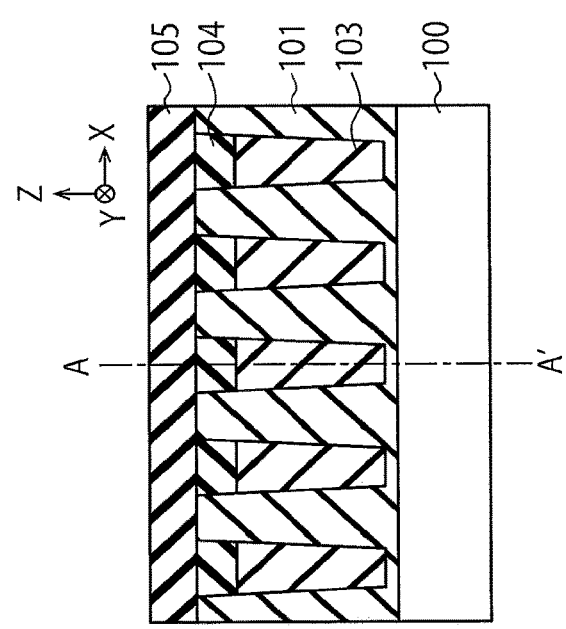
Figure 10C:
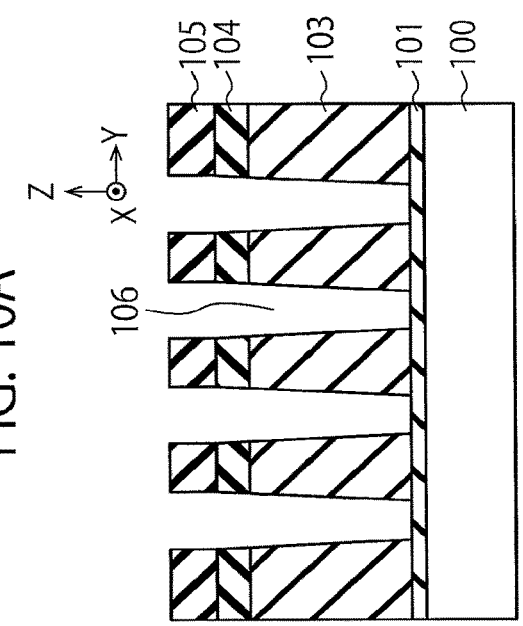

FIG. 9A illustrates five linear portions which include the insulators 103 and 104 and which extend in the Y direction, and FIG. 9B illustrates one linear portion which includes the insulators 103 and 104 and which extends in the Y direction. These linear portions are the same as the buried insulators 6 illustrated in FIG. 3B. Further, in FIG. 10C, each linear portion is divided into a plurality of (here, five) portions. Also in FIG. 10D, while one linear portion is divided into a plurality of portions, only one portion among these portions is illustrated. These portions are the same as the buried insulators 6 illustrated in FIG. 3C.

Concerning processes after the processes from FIG. 10A to FIG. 10D, the first embodiment and a comparative example thereof will be compared below.

FIGS. 11A to 11D are cross-section views illustrating a method of manufacturing a semiconductor device in the comparative example of the first embodiment.

In the present comparative example, after the processes from FIG. 10A to FIG. 10D, the hard mask layer 105 is removed using a chemical such as a fluoride solution (FIG. 10A to FIG. 10D). In this case, the insulator 104 which is a silicon dioxide film is less likely to be etched by the chemical. Meanwhile, the insulator 103 includes a portion where the insulator 103 remains to be the polysilazane liquid, and a portion where change from the polysilazane liquid to the silicon dioxide film is insufficient (for example, a portion of a silicon nitride film and a silicon oxynitride film). Therefore, the insulator 103 is likely to be etched by the chemical.

As a result, as illustrated in FIG. 11C and FIG. 11D, side faces of the insulator 103 are recessed. In this manner, in the present comparative example, because the buried insulators 6 include not only the insulator 104 but also the insulator 103, performance of the buried insulators 6 degrades, and, specifically, etching resistance of the buried insulators 6 degrades.

FIGS. 12A to 12D are cross-section views illustrating the method of manufacturing the semiconductor device of the first embodiment.

In the present embodiment, after the processes from FIG. 10A to FIG. 10D, part of the insulator 103 is re-oxidized through a post-oxidation process such as water vapor annealing (FIG. 12A to FIG. 12D). As a result, part of the insulator 103 turns into the insulator 104 formed with the silicon dioxide film. The silicon dioxide film is an example of a second material, and the insulator 104 formed through this oxidation is an example of a third portion.

Figure 12B:
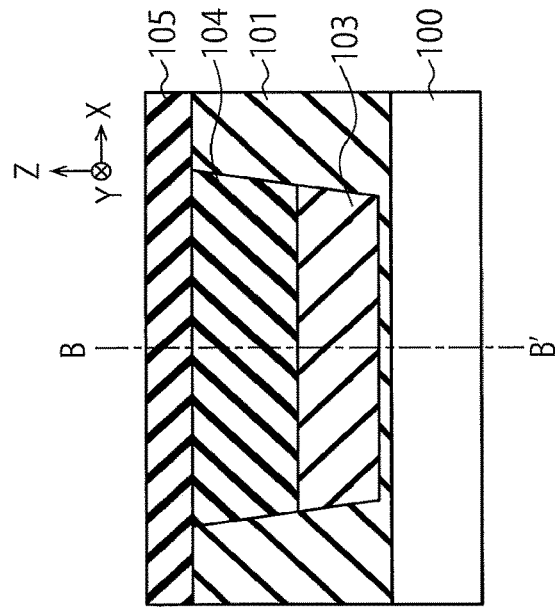
FIGS. 12A to 12D are cross-section views illustrating the method of manufacturing the semiconductor device of the first embodiment.
Figure 12D:
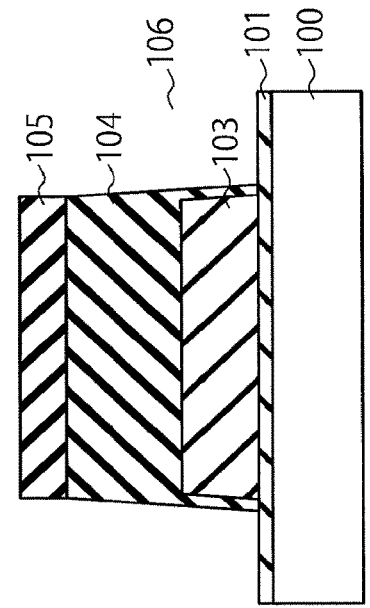
Figure 12A:
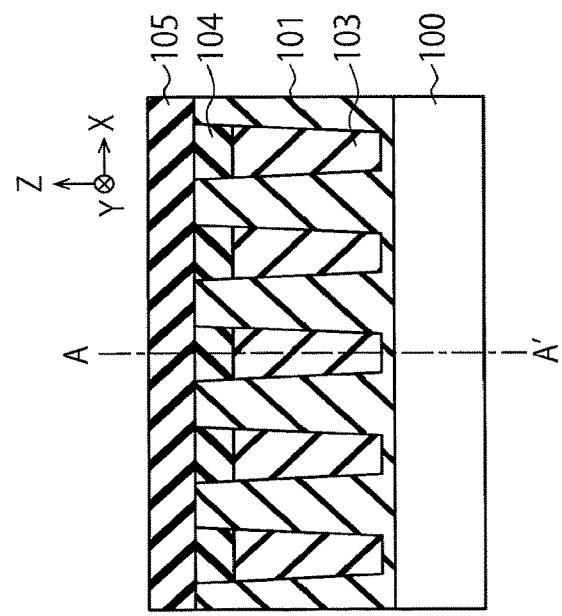
Figure 12C:
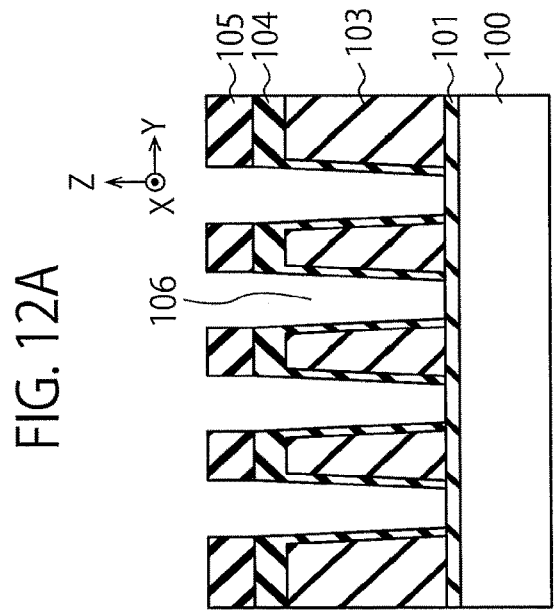

In this re-oxidation, oxidation of the insulator 103 proceeds from the side faces of the insulator 103. Therefore, as illustrated in FIG. 12C and FIG. 12D, only side portions (side wall portions) of the insulator 103 turns into the insulator 104, and central portions between the side portions remain to be the insulator 103. As a result, the insulators 104 are formed on the side faces of the insulators 103.

FIG. 12C illustrates five columnar portions which include the insulators 103 and 104 and which extend in the Z direction, and FIG. 12D illustrates one columnar portion which includes the insulators 103 and 104 and which extends in the Z direction. These columnar portions are the same as the buried insulators 6 illustrated in FIG. 3C.

A width of the columnar portions in the Y direction in FIG. 12C is set narrower. This width is an example of a first width. A width of the columnar portion in the Y direction in FIG. 12D is set wider. This width is an example of a second width which is longer than the first width. In this manner, while the columnar portions in FIG. 12C and FIG. 12D have different widths, the columnar portions are all re-oxidized so that the insulator 103 remains. Meanwhile, in a modified example of the present embodiment which will be described later, the former columnar portions are re-oxidized so that the insulator 103 does not remain.

In the present embodiment, by oxidizing the side wall portions of the insulators 103 which are insufficiently oxidized, it is possible to change the side wall portions to the insulators 104 which are sufficiently oxidized. It is possible to control a thickness of the side wall portions to be oxidized by process conditions such as a temperature and a period of the re-oxidation process. Examples of the re-oxidation process can include thermal oxidation treatment using an oxygen gas, water vapor oxidation using water vapor, ozone water treatment, oxygen plasma treatment, or the like.

In the present embodiment, thereafter, in a similar manner to the comparative example, the hard mask layer 105 is removed using a chemical such as a fluoride solution. At this time, in the present embodiment, because the insulators 103 are not exposed at the concave portions 106, it is possible to suppress occurrence of recess as illustrated in FIG. 11C and FIG. 11D. In this manner, according to the present embodiment, it is possible to improve performance of the buried insulators 6, and, specifically, it is possible to improve etching resistance of the buried insulators 6. However, it is preferable to adjust a period of chemical treatment so as to prevent the insulators 104 at the side wall portions from disappearing during the chemical treatment.

It can be considered to remove the hard mask layer 105 through ashing using an oxygen gas. Apparently, it is considered that the side wall portions of the insulators 103 are oxidized through this ashing. However, because oxidation power under ashing conditions for removing a mask is typically lower than oxidation power by the above-described re-oxidation process, it is difficult to form the insulators 104 through ashing.

In the present embodiment, after the hard mask layer 105 is removed, the tunnel insulators 2, the channel semiconductor layers 1 and the core insulators 8 are sequentially formed in the concave portions 106. As a result, the insulators 104 at the side wall portions are put between the remaining insulators 103 and the channel semiconductor layer 1 of the insulators 103.

FIGS. 13A to 13D are cross-section views illustrating a method of manufacturing a semiconductor device of the modified example of the first embodiment.

In the present modified example, after the processes from FIG. 10A to FIG. 10D, part of the insulators 103 is re-oxidized through a post-oxidation process such as water vapor annealing (FIG. 13A to FIG. 13D). As a result, in a similar manner to the present embodiment, part of the insulators 103 turns into the insulators 104 formed with the silicon dioxide film.

The present embodiment (FIG. 12A to FIG. 12D) and the modified example of the present embodiment (FIG. 13A to FIG. 13D) are compared below.

In the present embodiment, re-oxidation is performed in a short period of time so that the insulators 103 remain in the columnar portions in FIG. 12C and FIG. 12D. Meanwhile, in the present modified example, re-oxidation is performed in a long period of time so that the insulators 103 remain in the columnar portions in FIG. 13D and the insulators 103 do not remain in the columnar portions in FIG. 13C. The reason why the insulators 103 remain only in the columnar portions in FIG. 13D is that the width of the columnar portions in the X direction in FIG. 13D is wide.

Both in the present embodiment and the present modified example, it is possible to improve etching resistance of the buried insulators 6. However, because a volume of the insulator to be re-oxidized is small, it is possible to reduce shrinkage of the buried insulators 6, so that it is possible to reduce stress of the buried insulators 6, suppress warpage of the substrate 100, and suppress occurrence of a crack of the buried insulators 6 due to shrinkage. Meanwhile, in the present modified example, because a volume of the insulator to be re-oxidized is large, it is possible to improve insulation properties of the buried insulators 6 and reduce permittivity of the buried insulators 6. In this manner, the present embodiment is different from the present modified example in an oxidation amount of the buried insulators 6.

Both in the present embodiment and in the present modified example, nitrogen concentration in the insulator 104 is, for example, equal to or less than 1.0 atoms %. Here, in the present modified example, re-oxidation is performed so that the insulator 103 does not remain in the columnar portions in FIG. 13C. As a result, average nitrogen concentration in the respective columnar portions in FIG. 13C becomes nitrogen concentration in the insulator 104, and, therefore, becomes equal to or less than 1.0 atoms %

As described above, in the present embodiment, by oxidizing the upper faces of the insulators 103 and further oxidizing side faces of the insulators 103, the buried insulators 6 including the insulators 103 and 104 are formed. Therefore, according to the present embodiment, it is possible to improve performance of the buried insulators 6. For example, it is possible to form not only the upper faces of the buried insulators 6 but also the side faces of the buried insulators 6 with the insulator 104.

While, in the present embodiment, the processes from FIG. 5A to FIG. 10D and FIG. 12A to FIG. 12D are applied to a three-dimensional memory, the processes may be applied to other semiconductor devices. That is, these processes may be applied to an insulator other than the buried insulators 6.

Further, while, in the present embodiment, the insulators 104 are formed by oxidizing the insulators 103, the insulators 104 may be formed by performing other kinds of treatment on the insulators 103.

Further, while FIG. 12C and FIG. 12D illustrate the insulators 104 at the side wall portions having a uniform film thickness, the insulators 104 at the side wall portions do not have to have a uniform film thickness. For example, a film thickness of a portion where the insulators 104 at the side wall portions exist may be thicker as a height of the portion in the Z direction becomes higher.

Further, the insulator 103 may contain only Si atoms and N atoms, or may contain Si atoms, N atoms and other atoms. For example, in the case where the insulator 103 is a polysilazane liquid, the insulator 103 contains H atoms. Further, the insulator 103 may be a silicon oxynitride film (SiON).

In a similar manner, the insulator 104 may contain only Si atoms and O atoms, or may contain Si atoms, O atoms and other atoms. For example, in the case where the insulator 103 is a polysilazane liquid, there is a possibility that the insulator 104 may also contain H atoms derived from the polysilazane liquid. Further, the insulator 104 may contain N atoms derived from the insulator 103. A ratio of N atoms with respect to all atoms in the insulator 104 is, for example, equal to or less than 1%. Meanwhile, a ratio of N atoms with respect to all atoms in the insulator 103 is, for example, equal to or greater than 1%.

In the present embodiment, the insulator 104 is denser than the insulator 103, and nitrogen concentration in the insulator 104 is lower than nitrogen concentration in the insulator 103. Here, as can be seen from FIG. 12A to FIG. 12D, a ratio of the insulator 104 in the columnar portions in FIG. 12D is higher than a ratio of the insulator 104 in the respective columnar portions in FIG. 12C. Therefore, average nitrogen concentration in the columnar portion in FIG. 12D is lower than average nitrogen concentration in each columnar portion in FIG. 12C. Meanwhile, as can be seen from FIG. 13A to FIG. 13D, while the columnar portion in FIG. 13D includes the insulator 103 and the insulator 104, each columnar portion in FIG. 13C contains the insulator 104 but does not contain the insulator 103. Therefore, average nitrogen concentration in the columnar portion in FIG. 13D is higher than average nitrogen concentration in each columnar portion in FIG. 13C.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a plurality of electrode layers and a plurality of insulating layers alternately provided on a substrate and stacked in a first direction perpendicular to a surface of the substrate;
a plurality of semiconductor layers provided in the electrode layers and the insulating layers, extending in the first direction, and being adjacent to each other in a second direction parallel to the surface of the substrate;
first and second charge trapping layers provided between the semiconductor layers and the electrode layers sandwiching the semiconductor layers in a third direction that is parallel to the surface of the substrate and is different from the second direction; and
a plurality of insulators provided between the semiconductor layers that are adjacent to each other in the second direction, and including a first insulator having a first width in the second direction, and a second insulator having a second width that is longer than the first width in the second direction and having nitrogen concentration that is different from nitrogen concentration in the first insulator, the first or second insulator including a portion including a first material and a portion including a second material different from the first material.

2. The device of claim 1, wherein the first or second insulator includes a first portion including the first material, a second portion including the second material and provided on an upper face of the first portion, and a third portion including the second material and provided on a side face of the first portion.

3. The device of claim 2, wherein the third portion is provided between the first portion and one of the semiconductor layers.

4. The device of claim 1, wherein the first material includes silicon and nitrogen, and the second material includes silicon and oxygen.

5. The device of claim 1, wherein the first or second insulator includes a portion including the first material and a portion including the second material.

6. The device of claim 1, wherein average nitrogen concentration in the first insulator is equal to or less than 1.0 atoms %, and the second insulator includes a portion including the first material and a portion including the second material.

7. The device of claim 1, wherein nitrogen concentration in the second insulator is lower than nitrogen concentration in the first insulator.

8. The device of claim 1, wherein nitrogen concentration in the second insulator is higher than nitrogen concentration in the first insulator.

9. The device of claim 1, wherein the first and second insulators are in contact with third insulators provided between the semiconductor layers and the first and second charge trapping layers.

* * * * *